US 6,650,220 B2

(12) United States Patent
Sia et al.

(10) Patent No.: US 6,650,220 B2
(45) Date of Patent: Nov. 18, 2003

(54) PARALLEL SPIRAL STACKED INDUCTOR ON SEMICONDUCTOR MATERIAL

(75) Inventors: Choon-Beng Sia, Singapore (SG); Kiat Seng Yeo, Singapore (SG); Toe Naing Swe, Singapore (SG); Cheng Yeow Ng, Singapore (SG); Alex See, Singapore (SG)

(73) Assignee: Chartered Semiconductor Manufacturing Ltd. (SG)

( * ) Notice: Subject to any disclaimer, the term of this patent is extended or adjusted under 35 U.S.C. 154(b) by 0 days.

(21) Appl. No.: 10/131,334

(22) Filed: Apr. 23, 2002

(65) Prior Publication Data

US 2003/0197586 A1 Oct. 23, 2003

(51) Int. Cl.$^7$ ................................. H01F 5/00
(52) U.S. Cl. ................... 336/200; 336/223; 336/232; 29/602.1
(58) Field of Search ............... 336/200, 223, 336/232, 192; 29/602.1

(56) References Cited

U.S. PATENT DOCUMENTS

| 5,359,315 | A | * | 10/1994 | Inoue et al. | 336/200 |
| 5,936,298 | A | * | 8/1999 | Capocelli et al. | 257/531 |
| 5,969,590 | A | * | 10/1999 | Gutierrez | 336/200 |
| 6,002,161 | A | * | 12/1999 | Yamazaki | 257/531 |
| 6,380,608 | B1 | * | 4/2002 | Bentley | 257/531 |

* cited by examiner

Primary Examiner—Anh Mai
(74) Attorney, Agent, or Firm—Mikio Ishimaru

(57) ABSTRACT

A parallel spiral stacked inductor and manufacturing method therefore is provided. A substrate has a plurality of turns in a plurality of levels, the plurality of turns having a center proximate and a center distal ends. A first plurality of vias connecting the center proximate ends of the plurality of turns and a second plurality of vias connecting the center distal ends of the plurality of turns. A first connecting portion connects to the center proximate ends of the plurality of turns and a second connecting portion connecting to the center distal end of the plurality of turns. A dielectric material contains the inductor.

18 Claims, 2 Drawing Sheets

PARALLEL SPIRAL STACKED INDUCTOR ON SEMICONDUCTOR MATERIAL

TECHNICAL FIELD

The present invention relates generally to integrated circuits and more particularly to on-chip silicon-based inductors.

BACKGROUND OF THE INVENTION

Increasing demands for personal mobile communications equipment have motivated recent research activities to focus on the development of inexpensive, small size, low power consumption, and low noise level systems. To satisfy these requirements, one of the most important and indispensable circuit components is the on-chip silicon-based inductor.

As a result, miniaturization of the inductor on silicon has become a current key research area and extensive work has been done in this area. However, despite efforts by many researchers having skill in the art, achieving high performance on-chip inductors, i.e., high qualify factor (Q), still remains a major problem especially when radio frequency integrated circuits (RFICs) are built on silicon.

Conventional inductors built on silicon are generally planar in nature. The current complementary metal oxide semiconductor (CMOS) process uses a very conductive substrate. Spiral inductors fabricated on such a lossy substrate suffer from high capacitive and magnetic losses.

In addition, high dynamic resistance of metal lines at GHz frequency ranges further degrades the inductor performance in CMOS technology as compared to those fabricated in monolithic microwave integrated circuits (MMICs).

Many fabricating techniques, processes, and materials have been proposed to improve the performance of on-chip inductors. Tedious processing techniques such as etching away the silicon substrate under the inductor have been introduced to remove the substrate parasitic effects completely. Despite achieving good results, industries are reluctant to adopt such a technique because of reliability issues such as packaging yield, as well as long-term mechanical stability.

Another approach to minimize the substrate loss for silicon-based inductors has been to increase the substrate resistivity. This technique has yielded significant results, however, the substrate becomes unsuitable for building active MOS devices.

The most critical factor hindering the performance of silicon-based inductors is the high resistive aluminum-copper (AlCu) interconnects used in silicon processes.

In comparison, thicker and less resistive gold (Au) metalization together with lossless substrate in gallium arsenide (GaAs) technology permits high performance inductors to be fabricated easily. To overcome high metalization resistance, a popular technique is to have the layers of metal stacked together, thereby achieving a high Q inductor.

Another possible alternative is to use an active inductor. In an active inductor high Q factor and inductance can be achieved in a really small silicon area. However, such approach suffers from high power consumption and high noise levels that are not acceptable for low power and high frequency applications. In addition, performance of active inductors are very sensitive and dependent upon the inductor's biasing circuitry, making it time consuming and tedious to design.

As a result of the above, the simplest and most commonly used on-chip inductors are planar silicon-based spiral inductors, which require careful layout optimization techniques to improve performance.

In the conventional spiral inductor design, the inductor is planar and fabricated on a conductive silicon substrate. To improve the Q factor of the spiral inductors, the top metal is usually stacked with a few layers of lower metal through vias to minimize the overall metal series resistance. Nevertheless, when more layers are used to realize a very thick conductor, the whole spiral is brought closer to the substrate. This increases the spiral-to-substrate parasitic capacitance and hence results in a degradation of Q factor as well as the inductor's self-resonant frequency. Nevertheless, improvement and quality factors are still observed for a 4-layer stacked inductor at 2.45 gigahertz (GHz).

The above technique to improve the inductor's quality factor is well known and very popular in the industry since it involves no modification to the existing CMOS process flow. Currently, parallel inductors have never been explored because those skilled in the art expect the performance of such parallel inductors to be very poor. For a 2-metal-layer parallel inductor, its conductor parasitic resistance, especially high dynamic resistance at gigahertz frequencies will decrease by 50%. This helps improve the inductor's Q factor but its resultant inductance will also be lower by 50%. In typical planar parallel inductors, the advantage over the conventional spiral inductor is that vias required for the underpass center conductor connection can be omitted and this greatly reduces the conductor's series resistance; i.e., the inductors are planar, open, concentric rings which are commonly connected at their open ends. Comparing the inductance and Q factor of a conventional circular inductor (3-turn) and a planar parallel inductor, it was observed that by connecting the turns in a planar-parallel manner to form the spiral reduces the conductor's series resistance, thereby giving a higher Q factor. However, the inductance produced is very low compared to the conventional design. Therefore, the inductive behavior of such parallel inductors is expected by those skilled in the art to be unsatisfactory and this as been found to be the case.

Solutions to these problems have been long sought, but have long eluded those skilled in the art.

DISCLOSURE OF THE INVENTION

A parallel spiral stacked inductor and manufacturing method therefore is provided. A substrate has a plurality of turns in a plurality of levels, the plurality of turns having a center proximate and a center distal ends. A first plurality of vias connecting the center proximate ends of the plurality of turns and a second plurality of vias connecting the center distal ends of the plurality of turns. A first connecting portion connects to the center proximate ends of the plurality of turns and a second connecting portion connecting to the center distal end of the plurality of turns. A dielectric material contains the inductor.

The present invention provides a stacked parallel inductor wherein the performance is comparable if not better than the conventional stacked inductor. Despite achieving low inductance when metal strips are laid out in a parallel manner, Q factor of the inductor improves by a significant 30%. Hence, if metal strips can be connected in a parallel manner without affecting the overall inductance, such parallel inductors show tremendous potential in replacing the conventional stacked spiral inductors.

The present invention further provides an alternative, if not better solution, to replace the conventional stacked spiral inductor. The planar parallel inductor yields unsatisfactory results. Its low inductance can be overcome in the stacked parallel design. The layout of the parallel spiral conductors allows performance of parallel inductors to be comparable to conventional stacked inductors. The inductor of the present invention is achieved when vias along conductors of the conventional stacked inductor are removed. This means only the regions at the two ends of the metal layers making up the main spiral are connected with vias.

It has been found that even though conductors are electrically connected in parallel, the inductance value is not reduced as in the case of a planar parallel inductor. The stacked parallel inductor has a much higher inductance value compared to the parallel inductor because of the presence of mutual coupling between adjacent conductors. Since the conductors are stacked on top of each other, the large conductor surface areas as well as the thin inter metal dielectric promote a significant constructive mutual coupling effect. Hence, mutual inductance generated through this strong coupling compensates for the reduction in self-inductance of the metal lines when they are connected in a parallel fashion. The Q factor for the new design is observed to be slightly higher than the conventional stacked inductor at all frequencies.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
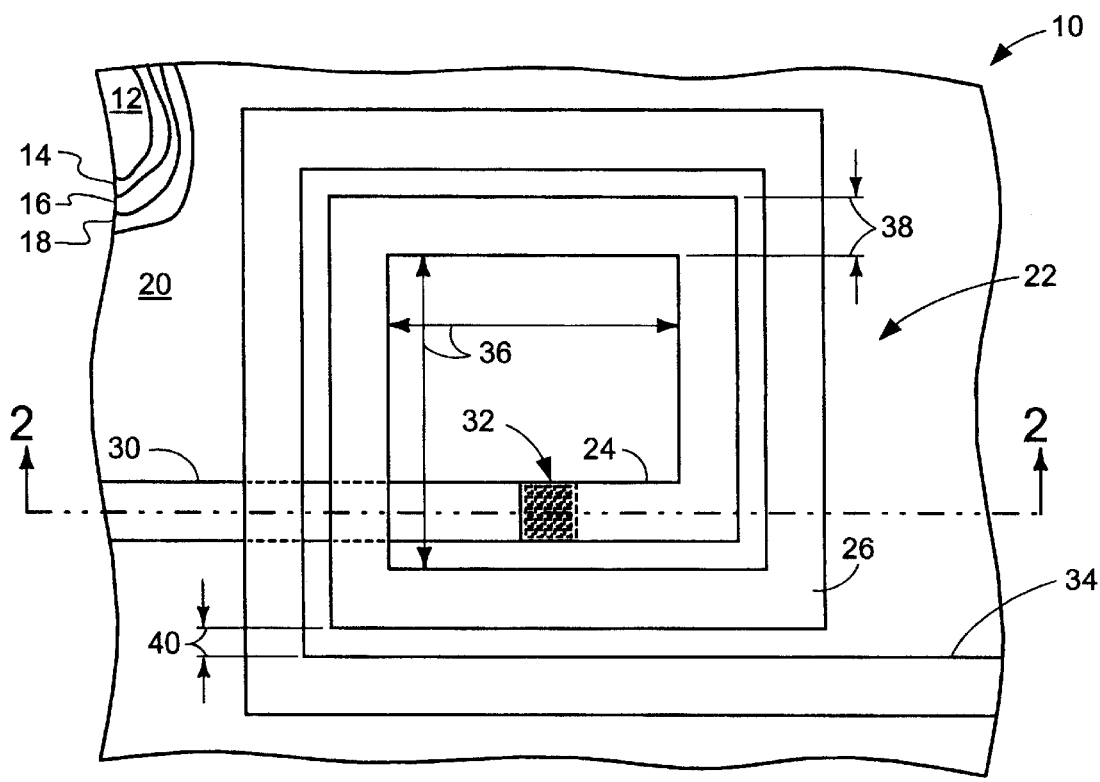
FIG. 1 (PRIOR ART) is a cross-sectional view of a prior art on-chip inductor along line 1—1 of FIG. 2 (PRIOR ART)
Figure 2:
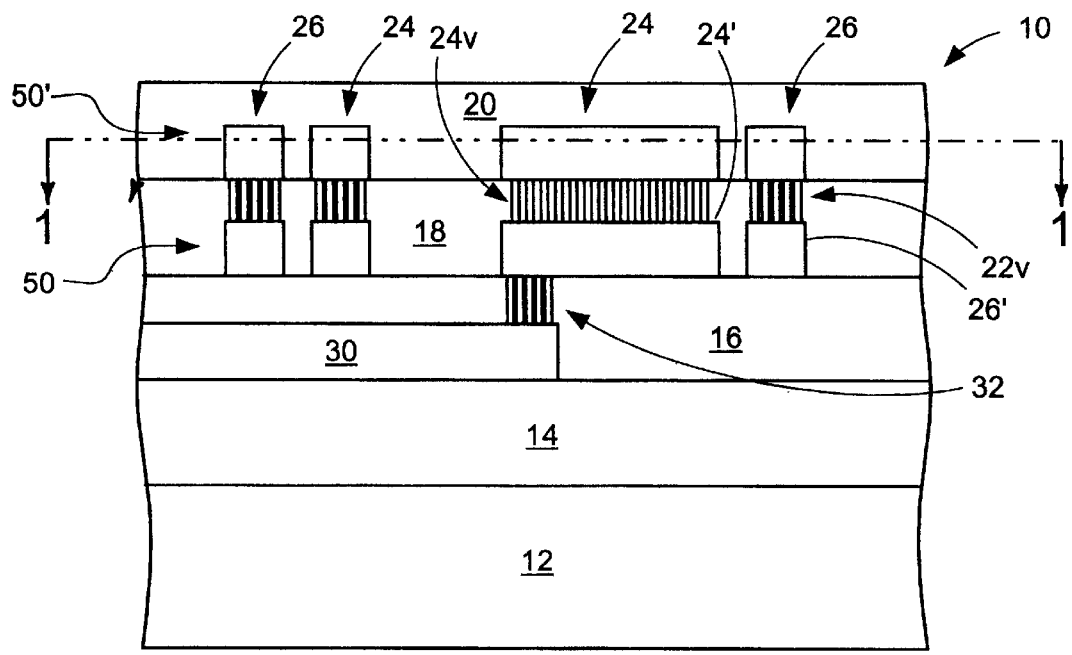
FIG. 2 (PRIOR ART) is a cross-sectional view of the prior art on-chip inductor along line 2—2 of FIG. 1 (PRIOR ART)

Referring now to FIG. 1 (PRIOR ART), therein is shown a cross-sectional view of a prior art on-chip inductor 10 along line 1—1 of FIG. 2 (PRIOR ART). A substrate 12, of a material such as silicon, has a plurality of dielectric layers formed thereon of a material such as silicon dioxide. Sequentially, a field dielectric layer 14 (such as a field oxide), a connecting interlayer dielectric (ILD) layer 16 (such as a silicon oxide), a first level ILD layer 18, and a second level ILD layer 20 are formed over the substrate 12. Embedded within the dielectric layers is a spiral stacked inductor 22.

The term "over" as used in herein is defined vertically above a horizontal plane parallel to the conventional surface of a wafer on which the on-chip inductor is formed regardless of the orientation of the wafer. Terms, such as "on", "below", "higher", "lower", "above", and "under", are defined with respect to the horizontal plane.

The term "processed" or "formning" as used herein to refer to the formation of vias and turns includes conventional semiconductor deposition of photoresist, hard and soft mask photolithography, etch, and strip, as appropriate.

In the prior art, the spiral stacked inductor 22 is a two-turn stacked inductor. In FIG. 1 (PRIOR ART), are shown first and second turns 24 and 26.

A first connecting portion 30 having connecting vias 32 connects to the spiral stacked inductor 22 at one end and a second connecting portion 34 connects at the other end.

The first turn 24 has an inner diameter 36, a width 38 which is common to each of the turns, and a spacing 40 between each of the turns. The first connecting portion 30 passes under the two turns and thus is also referred to as an underpass 30.

Referring now to FIG. 2 (PRIOR ART), therein is shown a cross-sectional view of the prior art on-chip inductor 10 along line 2—2 of FIG. 1 (PRIOR ART). The substrate 12 has the field dielectric layer 14 upon which a conductive material is deposited and patterned to form the underpass 30.

The connecting ILD layer 16 is then deposited over the underpass 30. One or more first via openings are formed in the connecting ILD layer 16 connected to the underpass 30.

A conductive material layer is deposited on the connecting ILD layer 16 and processed to form a first level of the spiral stacked inductor 22. When processed, first and second turns 24' and 26' of a first level 50' will be formed. The first via openings are also filled with conductive material to form connecting vias 32.

The first level ILD layer 18 is then deposited over the first level 50'. One or more second via openings are formed in the first level ILD layer 18 connected to the first and second turns 24' and 26' along their lengths.

A conductive material is deposited on the first level ILD layer 18 and processed to form the first and second turns 24 and 26 of a second level 50'. The first and second turns 24 and 26 are respectively connected to the first and second turn vias 24ν and 26ν along their lengths by the conductive material filling the respective vias openings to form first and second turn vias 24ν and 26ν.

The second level ILD layer 20 is then deposited over the second level 50'.

As will be understood by those skilled in the art, as a spiral stacked inductor has more turns, it will still have the same number of turns in each level and the turns will all be connected along their length by pluralities of vias.

Figure 3:
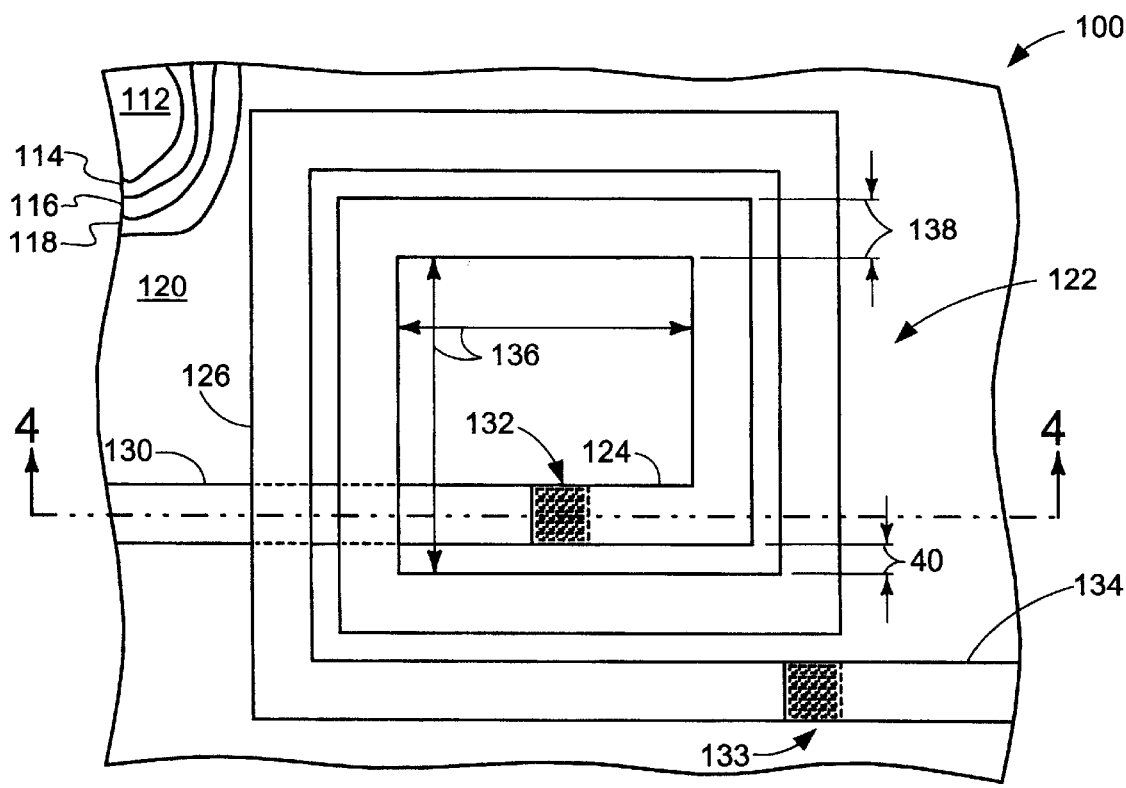
FIG. 3 is shown a cross-sectional view of a parallel spiral stacked inductor of the present invention along line 3—3 of FIG. 4.
Figure 4:
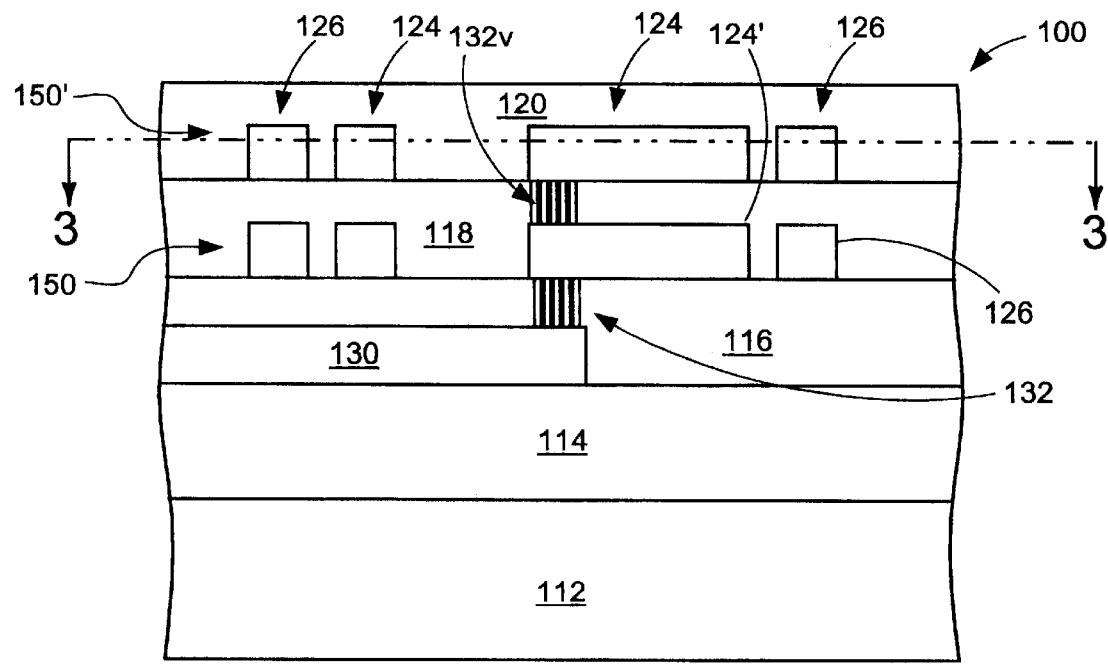
FIG. 4 is shown a cross-sectional view of the parallel spiral stacked inductor of the present invention along line 4—4 of FIG. 3.

Referring now to FIG. 3, therein is shown a cross-sectional view of a parallel spiral stacked on-chip inductor 100 of the present invention along line 3—3 of FIG. 4. A substrate 112, of a material such as silicon, has a plurality of dielectric layers formed thereon of a material such as silicon dioxide. Sequentially, a field dielectric layer 114 (such as a field oxide), a connecting interlayer dielectric (ILD) layer 116 (such as a silicon oxide), a first level ILD layer 118, a second level ILD layer 120, and a third level ILD layer 121 are formed over the substrate 112. Embedded within the dielectric layers is a parallel spiral stacked inductor 122.

The parallel spiral stacked inductor 122 is shown as being square spiral but it may also be circular spiral. Similarly, the parallel spiral stacked inductor 122 can be a spiral, which is either clockwise or counter clockwise as viewed from above.

In the described embodiment, the parallel spiral stacked inductor 122 is a parallel two-turn inductor. In FIG. 3, are shown first and second turns 124 and 126. Individually, the turns can be flat as shown or circular, and can be made from any conductive material including copper.

A first connecting portion 130 having connecting vias 132 connects to the parallel spiral stacked inductor 122 at one end and a second connecting portion 134 having connecting vias 133 connects at the other end.

The first turn 126 has an inner diameter 136, a width 138 which is common to each of the turns, and a spacing 140 between each of the turns. The first connecting portion 130 passes under the two turns and thus is also referred to as an underpass 130.

Referring now to FIG. 4, therein is shown a cross-sectional view of the parallel spiral stacked inductor 100 of the present invention along line 4—4 of FIG. 3. The substrate 112 has the field dielectric 114 upon which a conductive material is deposited and patterned to form the underpass 130.

The connecting ILD layer 116 is then deposited over the underpass 130. One or more first via openings are formed in the connecting ILD layer 116 connected to the underpass 130.

A conductive material layer is deposited on the connecting ILD layer 116 and processed to form a first level of the parallel spiral stacked inductor 122. When processed, first and second turns 124' and 126' of a first level 150' will be formed.

The first level ILD layer 118 is then deposited over the first level 150'. One or more second via openings formed in the first level ILD layer 118 connected to the center proximate end of the first turn 124' and to the center distal end of the first turn 124'.

A conductive material is deposited on the first level ILD layer 118 and processed to form the first and second turns 124 and 126 and the second connecting portion 134 of a second level 150'. The first and second turns 124 and 126 are respectively connected to the first and second turns 124' and 126' at their center proximate and center distal ends only by the conductive material filling the second via openings to form center proximate and center distal end vias 132v and 133, respectively.

The second level ILD layer 120 is then deposited over the second level 150'.

As will be understood by those skilled in the art, as the spiral stacked inductor 22 has more turns, it will still have the same number of turns in each level and the turns will all be connected by pluralities of vias. On the other hand, as the parallel spiral stacked inductor 122 has more turns, each level of spiral of turns will be only connected at the center proximate and center distal ends.

Also as will be understood by those skilled in the art, parallel circular stacked inductors could be made in the same fashion as shown with various diameters, widths, and spacings. Similarly, different metals can be used for the inductors including aluminum and copper.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of manufacturing a parallel stacked inductor comprising:

providing a substrate;

forming a first conductive material layer over the substrate;

processing the first conductive material layer to form a first turn;

forming a first dielectric layer over the substrate and the first turn;

forming first and second via openings in the first dielectric layer connected to only to distal ends of the first turn;

forming a second conductive material layer over the first dielectric layer and in the first and second via openings;

processing the second conductive material layer to form a second turn connected only to the distal ends of the first turn by the second conductive material in the first and second via openings forming first and second vias therebetween; and forming a second dielectric layer over the first dielectric layer and the second turn.

2. The method as claimed in claim 1 including:

forming third and fourth via openings in the second dielectric layer connected to only to distal ends of the second turn;

forming a third conductive material layer over the second dielectric layer and in the third and fourth via openings;

processing the third conductive material layer to form a third turn connected only to the distal ends of the second turn by the third conductive material in the third and fourth via openings forming third and fourth vias therebetween; and forming a third dielectric layer over the second dielectric layer and the third turn.

3. The method as claimed in claim 1 including:

forming a first connecting portion under the first turn and connected to one of the distal ends of the first turn.

4. The method as claimed in claim 3 including:

forming a second connecting portion while processing a conductive material layer selected from the group consisting of the second conductive material layer, the third conductive material layer, and a combination thereof.

5. A method of manufacturing a parallel spiral stacked inductor comprising:

providing a substrate;

forming a first conductive material layer over the substrate;

processing the first conductive material layer to form a first plurality of turns, the first plurality of turns having a center proximate and a center distal ends;

forming a first dielectric layer over the substrate and the first plurality of turns;

forming first and second via openings in the first dielectric layer respectively connected to only to the center proximate and center distal ends of the first plurality of turns;

forming a second conductive material layer over the first dielectric layer and in the first and second via openings;

processing the second conductive material layer to form a second plurality of turns connected only to the center proximate and center distal ends of the first plurality of turns by the second conductive material in the first and second via openings forming first and second vias therebetween; and forming a second dielectric layer over the first dielectric layer and the second plurality of turns.

6. The method as claimed in claim 5 including:

forming third and fourth via openings in the second dielectric layer connected to only to the center proximate and center distal ends of the second plurality of turns;

forming a third conductive material layer over the second dielectric layer and in the third and fourth via openings;

processing the third conductive material layer to form a third plurality of turns connected only to the center proximate and center distal ends of the second plurality of turns by the third conductive material in the third and fourth via openings forming third and fourth vias therebetween; and forming a third dielectric layer over the second dielectric layer and the third plurality of turns.

7. The method as claimed in claim 5 including:

forming a field dielectric layer over the substrate;

forming a connecting conductive material layer over the field dielectric layer;

processing the second conductive material layer to form a connecting portion, the connecting portion having a center proximate end;

forming a connecting dielectric layer over the field dielectric layer and the connecting portion; and forming a connecting via opening in the field dielectric layer connected to the center proximate end of the connecting portion;

and wherein:
processing the first conductive material layer connects the center proximate ends of the connecting portion and the first plurality of turns.

8. The method as claimed in claim 7 including:

forming a second connecting portion while processing a conductive material layer selected from the group consisting of the first conductive layer, the second conductive material layer, the third conductive material layer, and a combination thereof.

9. A parallel stacked inductor comprising:

a substrate;

a plurality of turns in a plurality of levels, the plurality of turns having distal ends;

a plurality of vias connecting the distal ends of the plurality of turns;

a first connecting portion connected to one of the distal ends of the plurality of turns in the level proximate the substrate;

a second connecting portion connected to the other of the distal ends of the plurality of turns; and a dielectric material containing the first and second connecting portions and the plurality of turns.

10. A parallel spiral stacked inductor comprising:

a substrate;

a plurality of turns in a plurality of levels, the plurality of turns having a center proximate and a center distal ends;

a first plurality of vias connecting the center proximate ends of the plurality of turns;

a second plurality of vias connecting the center distal ends of the plurality of turns;

a first connecting portion connected to the center proximate ends of the plurality of turns;

a second connecting portion connected to the center distal end of the plurality of turns; and a dielectric material containing the first and second connecting portions, the plurality of turns, and the first and second plurality of vias.

11. A parallel stacked inductor comprising:

a substrate;

a first turn of conductive material over the substrate;

a first dielectric layer over the substrate and the first turn;

a second turn of conductive material over the first dielectric layer;

first and second vias of conductive material connected only to the distal ends of the first turn; and a second dielectric layer over the first dielectric layer and the second turn.

12. The inductor as claimed in claim 11 including:

third and fourth vias of conductive material connected only to distal ends of the second turn;

a third turn of conductive material over the second dielectric layer connected only to the distal ends of the second turn by the third and fourth vias; and a third dielectric layer over the second dielectric layer and the third turn.

13. The inductor as claimed in claim 11 including:

a first connecting portion under the first turn and connected to one of the distal ends of the first turn.

14. The inductor as claimed in claim 13 including:

a second connecting portion of conductive material layer connected to a turn selected from the group consisting of the first turn, the second turn, the third turn, and a combination thereof.

15. A parallel spiral stacked inductor comprising:

a substrate;

a first plurality of turns of conductive material over the substrate, the first plurality of turns having a center proximate and a center distal ends;

a first dielectric layer over the substrate and the first plurality of turns;

a second plurality of turns of conductive material over the first dielectric layer;

first and second vias of conductive material respectively connected only to the center proximate and the center distal ends of the first plurality of turns; and a second dielectric layer over the first dielectric layer and the second plurality of turns.

16. The inductor as claimed in claim 15 including:

third and fourth vias of conductive material respectively connected only to the center proximate and the center distal ends of the second plurality of turns;

a third plurality of turns of conductive material over the second dielectric layer connected only to the distal ends of the center distal ends of the second plurality of turns by the third and fourth vias; and a third dielectric layer over the second dielectric layer and the third plurality of turns.

17. The inductor as claimed in claim 15 including:

a first connecting portion under the first plurality of turns and connected to the center proximate end of the first plurality of turns.

18. The inductor as claimed in claim 17 including:

a second connecting portion of conductive material layer connected to a turn selected from the group consisting of the first plurality of turns, the second plurality of turns, the third plurality of turns, and a combination thereof.

* * * * *